United States Patent [19]

Zarnoch

[11] Patent Number: 5,132,191

[45] Date of Patent: Jul. 21, 1992

[54] POLYMER SURFACES FOR SUBSEQUENT PLATING THEREON AND IMPROVED METAL-PLATED PLASTIC ARTICLES MADE THEREFROM

[75] Inventor: Kenneth P. Zarnoch, Scotia, N.Y.

[73] Assignee: General Electric Company, Schenectady, N.Y.

[21] Appl. No.: 603,648

[22] Filed: Oct. 26, 1990

[51] Int. Cl.$^5$ ............... B32B 15/08; B32B 15/20
[52] U.S. Cl. ................... 428/626; 428/412; 428/901; 428/675
[58] Field of Search .............. 204/30; 156/668; 427/307, 306; 428/612, 626, 675, 209, 901, 409, 412, 457; 174/259; 367/391

[56] References Cited

U.S. PATENT DOCUMENTS

| | | | |
|---|---|---|---|
| 4,775,557 | 10/1988 | Bastenbeck et al. | 427/307 |
| 4,832,799 | 5/1989 | Knudsen et al. | 428/626 |
| 4,941,940 | 7/1990 | Patel et al. | 428/626 |
| 4,959,121 | 9/1990 | Dumas et al. | 156/654 |

OTHER PUBLICATIONS

Crivello, J., Nitrations and Oxidations with Inorganic Nitrate Salts in Trifluoroacetic Anhydride, 1981, pp. 3056-3060, J. Org. Chem., 46.

Rantell, A., The Influence of Surface Chemistry on the Adhesion of Copper Deposited on Plastic Substrates, 1969, pp. 197-202, Transactions of the Institute of Metal Finishing, vol. 47.

*Primary Examiner*—Michael Lewis
*Assistant Examiner*—Valerie Lund
*Attorney, Agent, or Firm*—Sudhir G. Deshmukh; James C. Davis, Jr.; William H. Pittman

[57] ABSTRACT

Method of modifying an aromatic polymer surface to improve adhesion of a metal layer thereon and to the articles produced therefrom. Polymer molecules disposed on the surface of the aromatic polymer such as polycarbonate, are nitrated by a contact with a nitrating solution such as a mixture of nitric and sulfuric acid and then ammonolytically cleaved by a contact with an ammonolytic solution such as ammonium hydroxide. The ammonolyzed surface is thus chemically modified to become hydrophilic. The chemically modified surface is electrolessly plated with a primary metal layer. A secondary metal layer is then electrolessly or electrolytically applied on top of the primary metal layer until a metal layer of a desired thickness is attained.

The present invention further discloses articles such as an EMI shielded enclosure or a printed circuit board having metal layers as an EMI shield or a conductive metal trace pattern respectively.

14 Claims, No Drawings

POLYMER SURFACES FOR SUBSEQUENT PLATING THEREON AND IMPROVED METAL-PLATED PLASTIC ARTICLES MADE THEREFROM

BACKGROUND OF THE INVENTION

The present invention is directed to improved methods of plating metal on an organic polymer surface, and to improvements in the quality of metal plated organic polymer substrates.

Ever since structural plastics have replaced metal in the enclosures used in electrical appliances, microwave ovens, business machines, and other electrical/electronic products, manufacturers have had to overcome problems caused by electromagnetic interference in general (EMI) and radio frequency interference (RFI) in particular. The Federal Communications Commission (FCC), since 1983, requires that the electrical products not exceed certain specified EMI/RFI levels. The FCC requirements have been codified in the FCC regulation CRF 47, Part 15, Subsection J. The FCC requirements are met by reducing the EMI/RFI emission from the electrical/electronic products by providing a shielding. With the increased sensitivity of newer, higher-speed, and higher-frequency circuits plus a continued proliferation of electronic devices worldwide, EMI shielding problems are becoming more demanding. This has placed greater emphasis on high signal attenuation by the shielding medium.

The EMI shielded enclosures are also used to protect delicate electronic/electrical circuitry and components enclosed within the enclosure from damage by external sources such as static electricity or man-made high intensity EMI emission produced by an atmospheric nuclear explosion.

Electromagnetic and radio-frequency interference are often referred to as electronic noise. Electronic noise may occur naturally from sources such as lightening or static electricity or from man-made sources such as radio signals, radio games, computers, calculators, cash registers, electrical motors, automobile ignition systems, and all kinds of appliances, especially those that incorporate electronic components. A well-shielded enclosure enclosing the electrical components is often the quickest and the most cost-effective way to suppress man-made electromagnetic noise.

Enclosures for electrical components having metal cases, metal foil claddings, wire mesh screens, applied coatings, magnetic materials, and a variety of alternative approaches have been tried. However, because of their cost advantages and ease of processing, plastic enclosures having metallized coatings have emerged as the dominant choice.

In addition to the aforementioned plastic enclosures the present invention is also directed to printed circuit boards that have become the dominant vehicle for mounting and interconnecting electronic components in order to manufacture a desired electronic circuit. The printed circuit board usually comprises a sheet of a dielectric substrate constructed from various filled or unfilled synthetic materials. The substrate is provided with a pattern of thin metal foil which functions as a conductive path on one or both sides. The paths or "traces" are usually formed of a conductive material such as copper, palladium, nickel or gold. The traces collectively define all of the electrical connections between components on the board, and are routed between the appropriate locations on the board.

Thermoplastic materials such as polycarbonates are particularly suitable for printed circuit board substrates because of their impact strength, heat resistance, dimensional stability, and ease of moldability. However, polycarbonate substrates are not easily provided with a strongly adherent metal trace. The printed circuit, i.e., the plated metal conductive path, can be damaged or separated from the substrate during the subsequent manufacturing steps or during use of the circuit board.

Currently, a number of approaches have been tried to solve the problem of applying metallized coatings onto the plastic enclosures or substrates. One involves adding an electrically conductive material to a polymer composition from which a shielded enclosure is molded or formed. However, this method is limited by the type and the amount of conductive additives that can be incorporated into the polymer composition before the physical properties of the composition begin to deteriorate to unacceptable levels. Some work has been done in producing parts made from inherently conductive polymers, such as polyarylenes; however, these materials are intrinsically unstable.

A second approach involves the use of metal-loaded paints. Silver was popular before its rise in price. The paint industry has investigated all types of substitutes, including carbon black, copper and nickel. The most promising paints appear to be those loaded with nickel or copper. However, painted EMI shields are fraught with a number of problems such as chemical attack by the paint solvent on the underlying substrate, difficulty in disposing the paint waste in an environmentally safe manner, flaking, scratching or scuffing of the painted surface, difficulty in controlling the thickness of the painted surfaces, and the high cost of a painting operation.

Several attempts have been made to produce effective EMI shields at a reasonable cost. One of the most effective and promising methods involves electroless plating of the surfaces of the EMI shielded enclosures. Electroless or autocatalytic plating is defined as a deposition of a metal or alloy coating on a suitable substrate by a controlled chemical reduction that is catalyzed by the metal or alloy being deposited. *Thin Film Processes* (1978), *Vossen. J. and Kern. K.*, Page 213, lines 5–7. A great advantage of the electroless plating solutions is their ability to deposit conductive metal films or layers on the properly prepared non-conductors and their ability to uniformly coat any plateable objects. Electroless plating permits the deposition of pure-metal films onto a prepared molded part surface. Electrolessly metal plated surfaces of the substrates can be then easily electroplated to a desired thickness, either with the same metal or with a different metal or alloy. Thermoplastic materials such as polycarbonates are particularly suitable for making EMI shielded enclosures or housings due to their high impact strength, heat resistance, dimensional stability, and ease of moldability. However, polycarbonate substrates cannot be easily electrolessly plated or coated with a strongly adherent conductive metal layer.

Several attempts have been made to increase the adhesion of a conductive metal layer to polycarbonate substrates. Adhesion is generally measured as a "pull strength", i.e. a force required to pull an adherent metal layer from an underlying substrate under controlled conditions. The controlled conditions are specified in The American National Standard Test titled ANSI/ASTM D 3359-76, Measuring Adhesion by Tape Test.

One of the prior art methods for improving adhesion involves grit blasting the surface to provide a roughened profile on which the subsequently-applied metals can be anchored. Other methods call for the use of chemical swelling agents or penetrants to swell the surface prior to the application of a metal layer.

While such methods do increase adhesion, they are often not entirely satisfactory for several reasons. Such techniques result in physical degradation of the polymer surface thereby decreasing the tensile as well the impact strength of the underlying polymer substrate. The aforementioned physical degradation results from the swelling and cracking steps to which the entire substrate material is exposed. Additionally, such surface preparations cause crack formation and propagation of highly stressed areas such as sharp corners or edges of the enclosure being shielded. The presence of such cracks invariably results in a poorly shielded enclosure.

Therefore the primary object of this invention is to provide a method of applying highly adherent metal layers on a surface of an aromatic polymer substrate by chemically modifying the surface.

Another object of this invention is to provide a metal plated aromatic polymer substrate in the form of an EMI shielded enclosure wherein the noise generated by the enclosed electrical/electronics components is reduced to a desired level by the shielded enclosure.

Still another object of the present invention is to provide a printed circuit board comprising an electrically conductive, electrolessly plated metal trace pattern disposed on a chemically modified surface of an aromatic polymer substrate, the pattern having an improved adhesion to the surface of the substrate.

SUMMARY OF THE INVENTION

The present invention is directed to a method of modifying an aromatic polymer surface to improve adhesion of a metal layer on the surface which comprises nitration of polymer molecules disposed on the surface by a nitrating solution followed by ammonolytic cleavage of nitrated polymer molecules by an ammonolytic solution and to the articles produced therefrom. The surface of the aromatic polymer, such as polycarbonate, is nitrated by contact with the nitrating solution comprising nitric and sulfuric acid. The nitrated surface is then contacted with the ammonolytic solution such as ammonium hydroxide. The surface is thus chemically modified to become hydrophilic, a desired condition prior to metallization of the surface.

The present invention also discloses a method for applying a metal layer on the surface, chemically modified by the aforementioned method. A primary metal layer is electrolessly applied on the chemically modified surface. A secondary metal layer may then be electrolessly or electrolytically applied on top of the primary metal layer until the metal layer of a desired thickness is attained. A primary metal layer of copper may be followed by a secondary metal layer of nickel.

The present invention further discloses articles such as an EMI shielded enclosure or a printed circuit board having metal layers as an EMI shield or a conductive metal trace pattern respectively.

DETAILED DESCRIPTION OF THE INVENTION

The present invention is directed to pre-treating a surface of an aromatic polymer substrate by chemically modifying its surface chemistry to improve adhesion of a metal layer deposited on the surface. Generally an adhesion bond between the metal layer and the surface of the underlying substrate is established by an interfacial molecular contact between the metal layer and the surface. The interfacial molecular contact is directly proportional to the wettability of the polymer surface. The wettability of the polymer surface is defined in terms of an angle of contact of a liquid droplet on the surface. A wettable (hydrophilic) surface will have a lower angle of contact (acute angle) than a non-wettable (hydrophobic) surface, which has a higher angle of contact (obtuse angle).

In one of its embodiments, the process of this invention includes several steps. In the first two steps, the surface of a polymer substrate, such as an EMI shielded enclosure, is chemically modified before subjecting the surface to a metallization process. The surface is chemically modified by sequentially contacting the surface with the solutions disclosed hereinafter. In a third step, the chemically modified surface is catalytically activated to permit electroless metal deposition. In a fourth step the catalytically activated surface is electrolessly plated with a metal layer of a desired thickness. In further steps, the electrolessly plated surface may be electrolytically plated (electroplated) or electrolessly (autocatalytically) plated with another layer of a metal similar to the one underneath or a different metal. The steps are normally interposed with rinsing steps.

The polymeric substrate disclosed in the present invention is substantially aromatic. As used herein, the term "substantially aromatic" denotes a polymer in which a substantial proportion of the mers (i.e. repeating monomer-derived units) contain aromatic moieties, such as benzene or napthalene groups. In general, at least about 40% by number of the mers, preferably at least about 90% and frequently 100%, contain an aromatic moiety. The aromatic polymers forming the substrate can be selected from the group consisting of polycarbonates, polyimides, poly(alkylene terephthalates), poly(phenylene oxides), phenol alkylaldehydes, polystyrenes, polysulfones, and blends thereof. Preferred polymers used in the process of this invention are polycarbonates, those derived from bisphenol A being the most preferred.

Polycarbonates (PC) may be prepared by the reaction of dihydroxy aromatic compound such as bisphenol A with carbonyl chloride in an interfacial process. This reaction may be carried out under basic conditions in the presence of an aqueous and organic phase. Aromatic polycarbonates have a recurring moiety having the formula,

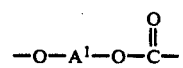

where $A^1$ is an aromatic radical. Illustrative Al radicals include those derived from bisphenol A, 2,2',6,6'-tetramethyl bisphenol A and 1,1-dichloro-2,2-bis(4-hydroxyphenyl) ethylene. Typical polycarbonates prepared from these and other aromatic dihydroxy compounds are well known in the art as illustrated by the following patents, incorporated herein by reference:

| | | | |
|---|---|---|---|
| 3,135,008 | 3,334,154 | 4,073,814 | 4,217,438 |
| 3,157,622 | 3,635,895 | 4,130,548 | 4,239,918 |
| 3,169,121 | 3,737,409 | 4,195,157 | 4,379,910 |
| 3,269,986 | | | |

The polycarbonate resins are commercially produced as Lexan® polycarbonate by General Electric Company, Makrolon® polycarbonate by Mobay Corporation and Calibre® polycarbonate by Dow Chemical Company.

The aromatic polyimides, under the class of suitable aromatic polymers, may be prepared by the reaction of a diamine (such as, m-phenylenediamine, 4,4'-diaminodiphenylmethane or 4,4'-diaminodiphenylether) with a dianhydride. Typical dianhydrides are pyromettallic dianhydrides, bis(3,4-dicarboxyphenyl) sulfone dianhydride, bis(3,4-dicarboxyphenyl) sulfide dianhydride and 2,2-bis[4-(3,4-dicarboxyphenoxy)phenyl]-propane dianhydride. Because of the ether groups present in the last-mentioned bisphenol A dianhydride, polyimides derived therefrom are normally designated "polyetherimides". Polyimides and polyetherimides are also known in the art as illustrated by the following patents, incorporated herein by reference:

| | | | |
|---|---|---|---|
| 3,356,691 | 3,850,965 | 3,983,093 | 4,118,535 |
| 3,422,064 | 3,933,749 | 4,048,142 | 4,297,474 |
| 3,803,085 | 3,944,517 | 4,092,297 | 4,331,799 |
| 3,847,867 | 3,968,083 | 4,107,147 | 4,332,929 |
| 3,847,869 | 3,975,345 | | |

The polyetherimide resins are commercially produced as Ultem® polyetherimide by General Electric Company.

Poly(ethylene terephthalate) (PET) may be prepared by oxidizing paraxylene to produce terephthalic acid which is then purified either by reaction with methanol to form dimethyl ester of terephthalic acid (DMT) or by further oxidation to form purified terephthalic acid (PTA). Another basic feed stream for PET is ethane, which is converted to ethylene oxide and then finally to ethylene glycol (EG). PET is a condensation polymer produced by reacting (DMT), or (PTA), and (EG) using a continuous melt-phase polymerization process, followed by a solid-state polymerization process that yields a highly crystaline pelletized product.

The poly(ethylene terephthalate) resins are commercially produced by Eastman Kodak Company.

The poly(phenylene oxide) polymers also known as polyphenylene ethers may be prepared by known methods, typically by an oxidative coupling polymerization of 2,6-dimethyl-phenol into a polymer characterized as 2,6-dimethyl-1,4-phenylene ether.

The poly(phenylene oxide) resins are commercially produced as PPO® by General Electric Company.

The polymer substrate disclosed in the present invention may also include various additives used for different purposes. The additives incorporated in the aromatic polymer of the present invention are selected from the group consisting of flame retardants, polymer chain initiators, polymer chain inhibitors, polymer chain stabilizers, plasticizers, color pigments, ultraviolet radiation absorbing agents, microwave absorbing agents, antistatic agents, impact modifiers, glass fibers, glass beads, carbon fibers, internal mold release agents, anti-oxidants, fillers, chemical blowing agents, silica, mica, and mixtures thereof.

In the first step of this invention, the surfaces of the enclosure, preferably of polycarbonate, are contacted for an effective time at an effective temperature with a nitrating solution of an effective concentration for nitrating the exposed surface. As used herein, "effective time, temperature and concentration" relate to a period of duration and degrees of temperature and concentration respectively required to achieve a level of nitration sufficient to produce a desired degree of chemical modification on the surface. In the presence of nitronium ions ($NO_2^+$) the aromatic rings at and near the surface undergo an electrophilic attack that results in having the nitro group substituted in the aromatic ring. It is expected that due to the activating power of the carbonate functionality, ortho substitution predominates. Since the nitronium ion is highly reactive, the rate of nitration is fast and a significant portion of the aromatic rings of the polymer chain segments disposed along the surfaces will be nitrated. However at some depth from the surface no nitration occurs. As a result a single polymer may contain chain segments disposed in superior position with respect to the surface that are nitrated and some that are in inferior position with respect to the surface that are not nitrated. The nitration step schematically is shown in the structural representation below,

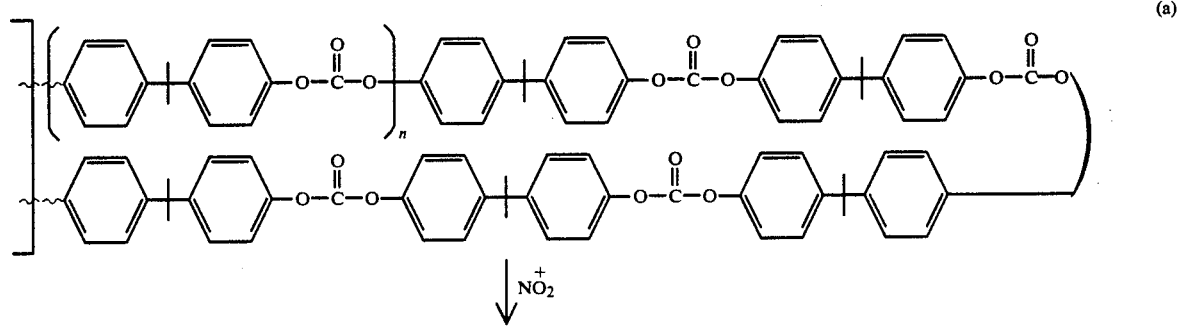

(a)

-continued

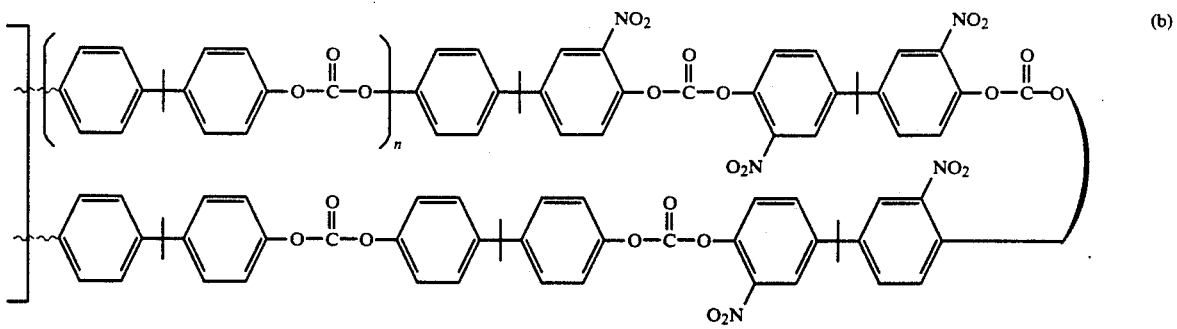

The nitrating solution includes a mixture of nitrating agents selected from the group consisting of nitric acid, acetyl nitrate, dinitrogen pentoxide, metal nitrate and nitronium tetrafluroborate, and dehydrating agents selected from the group consisting of sulfuric acid, acetic anhydride and trifluoroacetic anhydride. Some of the nitrating solutions are metal nitrate with trifluoroacetic anhydride, nitric acid with sulfuric acid, and nitric acid with acetic anhydride. The nitrating solution of the preferred embodiment comprises a mixture of one part of nitric acid dissolved in water at a concentration of at least about 60% by weight to about 70% by weight, preferably at about 60% by weight, with two parts of sulfuric acid dissolved in water at a concentration of at least about 90% by weight to at about 95% by weight, preferably at about 90% by weight.

Before the nitration of the surfaces of the enclosure, it may be necessary to clean the surfaces ultrasonically or with a solvent such as water, detergent such as for example Micro made by International Products Corp. or with a solvent having solvent characteristics similar to Freon® 1,1,2-trichloro-1,1,2-trifluoroethane but is safe to the environment. The cleaning step removes greases, oils and particulate matter such as dust particles from the surfaces. The effective time during which the nitrating solution is contacted with the surfaces is at about 0.5 to about 20 minutes, preferably for about 2 to about 5 minutes. The surfaces may be contacted with the nitrating solution by either immersing the enclosure in a bath containing the nitrating solution or by spraying or painting the solution on the desired surfaces of the enclosure if it is desirous for cosmetic reasons to provide an EMI shield coat only on the inner or hidden surfaces or walls of the EMI enclosure. The spraying or painting methods are well known in the art. The temperature of the nitrating bath or the sprayed nitrating solution is preferably maintained at about 10° C. to about 80° C. Those skilled in the art will readily realize that by manipulating the concentrations and the temperature of the nitrating solutions, the time of contact may optimized for particular processing conditions. The nitrating bath is preferably stirred during the nitrating step to improve the efficiency of the chemical reaction. The nitrated surfaces are then rinsed with water to remove any remaining nitrating solution from adhering to them. The surfaces after the nitration are still hydrophobic.

A second step of the invention is provided by contacting the nitrated polymer molecules disposed on the surface for an effective time at an effective temperature with an ammonolytic solution of an effective concentration for ammonolytic cleavage of the nitrated polymer molecules. As used herein, "effective time, temperature and concentration" relate to a period of duration, degrees of temperature and concentration respectively required to achieve a level of ammonolysis sufficient to produce a desired degree of chemically modified polymer molecules on the surface. Typically the ammonolytic solution includes a mixture of water and a compound from the group consisting of ammonium hydroxide and tetraalkylammonium hydroxides. The ammonolytic solution of the preferred embodiment comprises ammonia dissolved in water at a concentration of about 0.001% to about 30% by weight, preferably at about 10% to about 14% by weight. The ammonolytic solution, if needed, may also contain a pH adjuster such as alkali metal hydroxide.

It is theorized, without dependence thereon, that ammonolysis occurs when ammonia ($NH_3$) reacts with the aryloxycarbonate carbon bond proximal to the aromatic ring having the substituted nitro group. The aforementioned bond site is expected to be where a cleavage occurs as the nitro group can resonance stabilize the developing charge. Initially it is expected that ammonia reacts to form a hydroxyl (—OH) and a urethane ($H_2NC(O)O$—) group. However urethane is apparently unstable under the reaction conditions and it further reacts with ammonia to form urea ($H_2NC(O)NH_2$) and another hydroxyl group. The non-nitrated polymer chain segments anchored to the bulk of the polymer substrate are terminated with nitrophenol and phenol moieties. The overall result of the ammonolysis is schematically shown below,

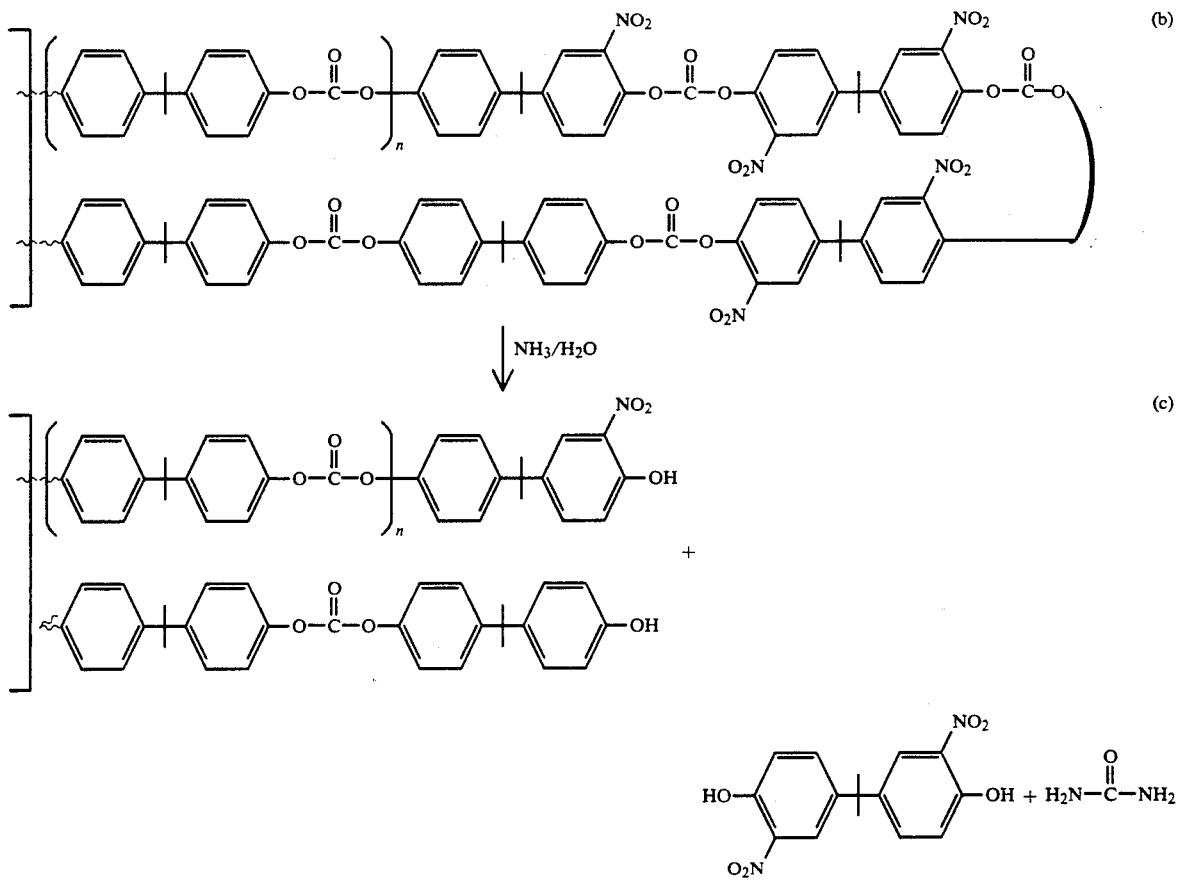

The effective time during which the ammonolytic solution is contacted with the nitrated surfaces is at about 1 minute to about 24 hours, preferably about 2 to about 6 minutes. The nitrated surfaces may be contacted with the ammonolytic solution by either immersing the enclosure in a bath containing the ammonolytic solution or by spraying or painting the solution on the desired nitrated surfaces of the enclosure if it is desirous for cosmetic reasons to provide an EMI shield coat on the inner or hidden surfaces or walls of the EMI enclosure. The spraying methods are well known in the art. The temperature of the ammonolytic bath or the sprayed ammonolytic solution is preferably maintained at about 5° C. to about 65° C. Those skilled in the art will readily realize that by manipulating the concentrations and the temperature of the ammonolytic solutions, the time of contact may be optimized for particular processing conditions. The ammonolytic bath is preferably stirred during the ammonolytic step to improve the efficiency of the chemical reaction. As a result of the ammonolysis surfaces of the polycarbonate substrate turn deep yellow with some evidence of surface dissolution. The ammonolyzed surfaces are then rinsed with water to remove any remaining ammonolytic solution adhering to them. The rinsed surfaces are hydrophilic, smooth and have pale yellow color. If the ammonolyzed surface is placed in an aqueous solution of a dilute acid, it appears nearly colorless. However if the ammonolyzed surface is placed in an aqueous solution of a dilute base it appears yellow. This pH dependent shift is rapid and reversible and thereby appears to demonstrate the presence of nitrophenol functionality disposed along the polycarbonate surfaces. According to the Merck Index, the compound o-nitrophenol is used as a pH indicator (a pH of 5.0 appears colorless whereas a pH of 7.0 appears yellow). X-ray Photoelectron Spectroscopic analysis and static Secondary Ion Mass Spectroscopic analysis of the chemically modified polymer confirms the presence of nitrophenol moieties.

In the third step, the chemically modified surfaces are catalytically activated by the methods well-known in the art and described, for example, in U.S. Pat. No. 3,589,916, as well as in U.S. Pat. Nos. 4,873,136 and 4,842,946 to Foust et al., and in U.S. Pat. No. 4,775,449 to Dumas et al., all aforementioned patents being incorporated herein by reference. For example, the substrate may be catalytically activated by contacting with an acid solution of a precious metal, such as palladium chloride in hydrochloric acid, for a period of time sufficient to cause the catalytic activation of the substrate surface, wherein the palladium is adsorbed on the exposed surfaces.

It is often useful to begin the activation of the substrate by treatment with an additive which aids in adsorption of the plating catalyst. Such additives are well-known in the art. Exemplary aids to catalyst adsorption include Shipley 1175A, a product of the Shipley Company, and Metex® 9420 preactivator surfactant, a product of the MacDermid Corporation. Immersion in about 0.1% to about 5% by volume of either of these agents in water for about 1 minute to about 10 minutes at a temperature of from about 40° C. to about 80° C. is usually sufficient. Although such a treatment is not deemed critical to the present invention, its use often enhances the uniform deposition of electrolessly applied metals onto the substrate.

One illustrative activation technique involves immersing the substrate in a solution of Shipley Cataprep ® 404 precatalyst a product of the Shipley Company. This solution provides a protecting agent for the plating catalyst subsequently applied, and comprises sodium bisulfate and various surfactants. The substrate may then be immersed in a solution of Shipley Cataposit ® 44, catalyst which contains the Cataprep ® 404 precatalyst ingredients, tin, and palladium, which is the electroless plating catalyst. The substrate may also be immersed in a solution of Macuplex D-34-C made by MacDermid Inc. having palladium/tin particles in colloidal form. After a water rinse, the substrates may then be immersed in a solution of Shipley Cuposit ® Accelerator 19, a fluoroboric acid-containing formulation used to separate tin from the plating catalyst.

Activation and plating processes suitable for the present invention are also described in W. T. Grubb et al., European No. EP 272,420, incorporated herein by reference, and also in U.S. Pat. Nos. 3,011,920 and 3,841,881, issued to Shipley and Feldstein et al., respectively, both of which are also incorporated herein by reference. A water rinse generally follows the activation step.

After surface activation and rinsing, the fourth step of the present invention, namely electroless plating of a primary metal layer, can be undertaken. Illustrative metals used to form the metallization layer include copper, palladium, nickel, silver, platinum, cobalt, gold or a combination thereof. A secondary metal layer may be electrolessly applied on top of the primary metal layer. A metal layer may be formed from a composite of a copper layer followed by a nickel layer in preparing an EMI shielded enclosure, however a metal layer preferably comprises a first nickel layer proximately positioned to the chemically modified surface followed by a copper layer and a second nickel layer on top of the copper layer wherein the copper layer is sandwiched between the first and the second nickel layer. The nickel layer is typically used to protect the EMI copper layer shield from corrosion and abrasion. The adhesion mechanism between the modified polymeric chain and metal (M), though not fully understood, is believed to be as shown in the structural representation below,

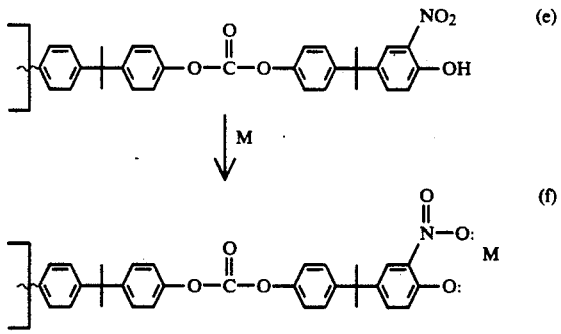

Electroless baths are well-known in the art and are generally described in the *Kirk-Othmer Encyclopedia of Chemical Technology*, 3rd Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular plastic serving as the substrate, and also upon the particular metal being deposited thereon. Suitable plating baths include the Shipley Cuposit ® 251 electroless copper bath, the Enthone ® 406 electroless nickel bath and the Enplate ® Ni-426 electroless bath, latter two made by Enthone Inc. Furthermore, the Grubb et al. application and Dumas et al. patent, mentioned above, list suitable electroless plating formulations. Immersion times, bath temperatures, and other operating parameters can be determined and controlled according to manufacturers' suggestions in order to deposit the metal layer of a desired thickness in a desired duration of time. Those having ordinary skill in the plating art will be able to determine the most appropriate plating regimen for a particular situation.

The aromatic polymer surface may be subjected to a heat treatment after an electroless deposition of the metal. Oven heating of the entire article, i.e., substrate with metal thereon, is sufficient, although any heating method is suitable. Typically, this heat treatment is carried out at a temperature ranging from about 45° C. to about 170° C. for about 5 minutes to about 120 minutes, with higher temperatures within the above range generally compensating for shorter duration, and vice versa. The aforementioned heat treatment is preferably carried out at about 80° to about 120° C. Although the mechanism is not understood, the heat treatment appears to reduce the time required to attain optimal adhesion.

If another layer of metal is to be electrolytically applied on the surface, e.g., by electroplating, the above-described heat treatment can in some instances be omitted if a heat treatment is employed after the plating of more of the metal, as described below. However, preferably the heat treatment is provided prior to electrolytic deposition of metal. Some of the embodiments include a heat treatment prior to the electrolytic deposition of metal (i.e., after the electroless deposition), along with another heat treatment after the final layer of metal has been applied, as described below.

Even though electroplating is one of the methods for applying a secondary or a second metal layer, an electroless plating as described above, is the preferred choice. The substrate is usually cleaned prior to immersion in the electroplating bath. The cleaning can be performed by rinsing the substrate with a dilute solution of a strong acid, such as 10% by weight of sulfuric acid in water.

Electroplating or electrolytic plating baths are well-known in the art and are described, for example, in U.S. Pat. No. 4,555,315, incorporated herein by reference, although the particular electroplating bath used is not critical to the present invention. The choice of course depends in part on the particular metal being deposited. Suitable metals include those described for the electroless deposition. Furthermore, those skilled in the art appreciate that the particular bath contents will depend upon some of the factors considered for the electroless deposition of metal described above. Typically, the electroplating bath for copper is operated at a temperature ranging from about 16° C. to about 38° C., with a cathode current density in the range of about 1 ASF to about 80 ASF. A description of baths for plating copper or various other metals is given in the Kirk-Othmer reference described above, in Vol. 8, beginning on page 826. Baths used to apply a layer of copper to the electrolessly applied layer typically include an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the desired end use of the metal-coated substrate.

As also described in the aforementioned application of Grubb et al., and in the patent of Foust et al. the metal applied on the polycarbonate substrate may be in the form of a pattern. Exemplary patterning methods are also described in U.S. Pat. No. 3,562,005, issued to DeAngelo et al., incorporated herein by reference. The metallic pathway formed after electrolessly plating the activated surface will tightly adhere to the underlying polymer substrate because of the chemical modification treatment disclosed in the present invention.

The electrolessly metallized layer when used as an EMI shield is preferably about two micrometers in thickness. In other embodiments, such as a printed circuit board, the electrolessly metallized layer prepared by the method of this invention usually has a thickness of about 1 micrometers to about 5 micrometers and if an electrolytic metal layer is applied thereon, it is at least about 1 micrometers in thickness.

An article prepared by the method of this invention comprises an aromatic substrate, preferably of polycarbonate, wherein a surface of the substrate has ammonolytically cleaved aromatic polymer molecules containing nitro groups, and a metal layer disposed on the surface. The metal layer comprises an electrolessly applied primary layer on the pretreated surface. Additional secondary metal layers may be electrolessly or electrolytically applied on top of the primary metal layer until a desired thickness is attained. The present invention contemplates various combinations of metal layers such as a single copper layer, a primary copper layer followed by a secondary nickel layer or a primary nickel layer followed by a secondary copper layer and a tertiary nickel layer, the last one being the preferred combination.

Articles of various embodiments of this invention are suitable as EMI shielded enclosures, printed circuit boards or housings having an EMI shield and a printed circuit board wherein the circuit board is an integral part of the housing and contains metallic layers as described herein as a printed circuit pattern or "trace".

An article of manufacture of the preferred embodiment of the present invention is an article such as an EMI shielded enclosure having three metal layered EMI shields. Preferably the first layer is an electrolessly applied first nickel layer on the surfaces of the walls of the enclosure, the second layer being electrolessly applied or electrolytically applied copper disposed on top of the first nickel layer and the third layer being electrolessly applied or electrolytically applied second nickel layer disposed on top of the second layer.

Another embodiment of the present invention comprises an aromatic polymer enclosure preferably of polycarbonate, having walls with an inner and an outer side wherein surfaces of the walls of the enclosure have ammonolytically cleaved polymer molecules having nitro groups for improving adhesion of electroless metal deposition and a first metal layer of copper thereon. A second metal layer of nickel may be disposed on top of the first metal layer, the second layer being electrolessly or electrolytically applied on the first layer. As stated earlier, the second layer is preferably deposited by the electroless metal deposition. Both the metal layers may be disposed, if so desired, on the interior sides of the walls of the enclosure. The metal layers have a predetermined combined thickness in accordance with the requirements set forth in the FCC regulations for noise such that intensity of noise emitted by the electrical components enclosed within the enclosure is reduced to a desired level by the metal layers. The combined thickness of the first and second metal layers is adjusted to meet the FCC requirements. The shielding of the enclosure may be also used to protect the electrical components enclosed within the shielded enclosure from electro-magnetic radiation of a specified range of frequency of about 1 KiloHertz to about 10 GigaHertz.

Still another embodiment is a flat or three-dimensional printed circuit board (PCB) of the present invention. The PCB may be of positive or a negative image type. The PCB comprises an aromatic polymer substrate, preferably of polycarbonate, whose surfaces have ammonolytically cleaved polymer molecules containing nitro groups for improving adhesion of an electrolessly applied first metal layer, followed by an electrolessly applied or an electrolytically applied second metal layer disposed on top of first metal layer, wherein the first and second metal layers provide a pattern of traces of desired thickness with which to provide electrical interconnection between electrical components disposed on the PCB and external electrical means. The preferred metal layers are of copper.

Yet another embodiment of the present invention is an enclosure for electrical components comprising a polycarbonate housing having an integrally created shell and a substrate wherein surfaces of the shell and the substrate have ammonolytically cleaved polycarbonate molecules containing nitro groups, a metal layer disposed on the surfaces of the walls wherein the metal layer provides an EMI shield; and an electrically conductive metal trace pattern disposed on the surfaces of the substrate which provides electrical interconnections between the electrical components disposed on the substrate and external electrical means. The shell and the substrate are typically molded as a single unit by well known methods such as injection molding.

In these examples, adhesion of the metal to the substrate was evaluated by applying ASTM D3359-78, Method B Cross-Cut Tape Test mentioned earlier. Method B, summarized below, comprises:

1. cutting, with a sharp knife blade, a cross hatch pattern in single pass uniformly applied strokes through the metal layer disposed on the substrate area being evaluated by the test;
2. removing the debris generated during the cutting procedure;
3. evenly applying over the cross hatched area the recommended adhesive tape, having an adhesive strength of 36 ±2.5 ounce per inch;
4. pulling the tape away from the area at 90° to the surface in one quick stroke; and
5 checking the tape for any metal flakes.

A classification of 5 means no metal layer was flaked off the surface whereas a classification of 0 means greater than 65% of the metal layer was flaked off the surface. The intermediate range of classification denotes percentages of flaking occuring between greater than 0% to less than 65%. The classification values for each tape are obtained and then averaged.

The present invention will be further understood from the description of specific examples which follow.

These examples are intended for illustrative purposes only and should not be construed as a limitation upon the broadest aspects of the invention. All liquid ratios are by volume, unless otherwise indicated.

EXAMPLE 1

A plaque of 2 inches×3 inches×⅛ inches in size, molded of Lexan® polycarbonate BE2130A, was treated as follows:

The substrate was ultrasonically cleaned for 5 minutes at 24° C. in a solution comprising 2 volume percent of Micro detergent and 98% by volume of deionized water. The substrate was subsequently rinsed with water and air dried. The substrate was immersed in the nitrating solution, comprising 1 part by volume of nitric acid (assay $HNO_3$ 70–71%) and 2 parts by volume of sulfuric acid (assay $H_2SO_4$ 95.5–96.5%), at 23° C. for 3 minutes. The substrate was then rinsed in tap water for less than one minute, followed by a 5 minute rinse in tap water at 65° C., and then cooled to 23° C.

The sample was then immersed in a solution comprising 1 part by volume of ammonium hydroxide (assay $NH_3$ 28.0–30.0%) and 1 part by volume of deionized water at 23° C. for 4 minutes, and subsequently rinsed in tap water at 23° C. for 5 minutes. The substrate was catalyzed by a 2 minute immersion into a solution at 23° C. comprising 77.2% deionized water, 22% hydrochloric acid (assay HCl 36.5–38.0%), and 0.8% of Macuplex D-34-C containing colloidal palladium/tin particles that adsorb onto the substrate surface. The sample was subsequently rinsed with water for 1 minute and then immersed in an accelerator, a solution comprising 1 part by volume Shipley Cuposit® Accelerator 19, and 5 parts by volume deionized water. The substrate was then rinsed in tap water for about 2 minutes.

The sample was metallized with Enplate® Ni-426, a low phosphorus electroless metal formulation. The bath was formulated per the recommendation by the manufacturer and was maintained at 54° C.±1° C. and at pH 6.1–6.2. The substrate was immersed in this bath for 1 hour. The plated article was removed and rinsed in tap water for about 2 minutes and then air dried. The nickel thickness was determined to be 3.1 micrometers by x-ray fluorescence on a Seiko SFT/156 x-ray instrument made by Seiko Instruments and Electronics, Ltd. The adhesion of the metal coating was measured by using a tape test as per the procedures outlined in ASTM D3359-78 Method B. A cross-cut tool made by Precision Gage & Tool Co. was used to scribe a grid of 10×10−1 millimeters×1 millimeters squares. Tape was evenly applied against the grid and removed in a manner consistent with the test procedure. The observation of the scribed area showed that the metallization was completely smooth and no flaking of any parts of the squares was observed thereby indicating an ASTM adhesion classification of 5. The sample was baked in an air oven for 30 minutes at 80° C.±2° C. The sample was then removed and allowed to cool to 23° C. and the adhesion of the metal coating was rechecked in the manner as outlined above. An adhesion classification of 5 was again obtained.

EXAMPLES 2-17

Various grades of Lexan® polycarbonate were processed under various conditions using the nitrating and the ammonolytic solutions of the composition disclosed in Example 1. The specific parameters are summarized in Table 1 shown hereafter.

TABLE 1

| Example # | LEXAN Poly-carbonate Grade | Nitrate[5] $A^1$ | $B^2$ | Rinse[6] $A^1$ | Ammono-lysis[7] $A^1$ | Rinse[6] $A^1$ | Cata-lyze[8] $A^1$ | Rinse[6] $A^1$ | Accel-erate[9] $A^1$ | Rinse[6] $A^1$ | Electroless Nickel Plate[10] $A^1$ | $B^2$ | $C^3$ | Adhesion classification[4] |
|---|---|---|---|---|---|---|---|---|---|---|---|---|---|---|
| 2 | BE2130A | 1 | 45 | 1 | 2 | 5 | 5 | 1 | 5 | 5 | 45 | 50 | 2.6 | 5 |
| 3 | BE2130A | 1 | 45 | 1 | 6 | 5 | 5 | 1 | 5 | 5 | 45 | 50 | 2.9 | 5 |
| 4 | BE2130A | 3 | 25 | 1 | 5 | 5 | 5 | 1 | 5 | 5 | 20 | 50 | 1.2 | 5 |
| 5 | BE2130A | 7 | 25 | 1 | 10 | 5 | 5 | 1 | 5 | 5 | 20 | 50 | 1.3 | 5 |
| 6 | BE2130A | 2 | 45 | 1 | 6 | 5 | 5 | 1 | 5 | 5 | 35 | 50 | 2.6 | 5 |
| 7 | BE2130A | 2 | 45 | 1 | 5 | 5 | 5 | 1 | 1 | 2 | 30 | 50 | 1.9 | 5 |
| 8 | 121 | 3 | 25 | 1 | 10 | 5 | 7 | 1 | 5 | 5 | 15 | 50 | 1.3 | 5 |
| 9 | 121 | 3 | 25 | 1 | 20 | 5 | 7 | 1 | 5 | 5 | 15 | 50 | 1.3 | 5 |
| 10 | 121 | 3 | 25 | 1 | 20 | 5 | 7 | 1 | 5 | 5 | 25 | 50 | 2.9 | 5 |
| 11 | 920A | 20 | 25 | 1 | 5 | 5 | 7 | 1 | 5 | 5 | 15 | 50 | 1.2 | 5 |
| 12 | 920A | 3 | 25 | 1 | 8 | 5 | 7 | 1 | 5 | 5 | 15 | 50 | 1.0 | 5 |
| 13 | ML6000 | 3 | 25 | 1 | 3 | 5 | 7 | 1 | 5 | 5 | 15 | 50 | 2.5 | 5 |
| 14 | ML6200 | 3 | 25 | 5 | 6 | 5 | 3 | 1 | 1 | 2 | 60 | 50 | 4.1 | 5 |
| 15 | ML6200 | 2 | 25 | 5 | 5 | 5 | 2 | 1 | 1 | 2 | 15 | 60 | 2.2 | 5 |
| 16 | ML6200 | 2 | 25 | 5 | 5 | 5 | 2 | 1 | 1 | 2 | 90 | 60 | 5.2 | 5 |
| 17 | ML6200 | 3 | 25 | 5 | 6 | 5 | 3 | 1 | 1 | 2 | 15 | 70 | 3.6 | 5 |

[1] in minutes
[2] in degrees centigrade
[3] in micrometers
[4] performed according to ASTM D3359-78 Method B test
[5] nitrating solution at 23° C. - 1 part by volume of nitric acid (assay $HNO_3$ about 70–71%) with 2 parts by volume of sulfuric acid (assay $H_2SO_4$ about 95.5–96.5%)
[6] Rinse in tap water
[7] ammonolytic solution at 23° C. 1 part by volume of ammonium hydroxide (assay $NH_3$ about 28–30% and 1 part by volume of deionized water
[8] catalyzing solution at 23° C. - 77.2% by volume of deionized water, 22% by volume of hydrochloric acid (assay HCl about 36.5–38%) and 0.8% by volume of Macuplex D-34-C
[9] 1 part by volume of Shipley Cuposit® Accelerator 19 and 5 parts by volume of deionized water
[10] Enplate® Ni-426 electroless metal formulations
A Time
B Temperature
C Thickness None of the substrates in the aforementioned examples were cleaned prior to the nitration step. All the rinses unless otherwise stated were in flowing tap water at about 15° C. The nickel plating baths were maintained at a pH of about 6.1–6.3.

EXAMPLE 6

The substrate sample of example 6, shown in Table 1, was provided a further treatment after nickel plating. The aforementioned substrate was baked at about 85° C.±2° C. for about one hour. Once the substrate cooled, the adhesion of the metallized layer was checked. The quality of the adhesion classification remained at 5. Subsequently, the substrate sample was placed in a chamber partially filled with deionized water. The sample was held in the chamber above the water level. The chamber was then closed and placed into an oven, maintained at about 65° C.±2° C. and about 100% relative humidity. The adhesion of the metal coating was checked by the aforementioned ASTM tape test method after 1, 3 and 10 days of exposure to the environment within the chamber. In all the cases, the adhesion classification of 5 was obtained.

EXAMPLE 7

The sample of example 7, as shown in Table 1, was a plaque having a size of 2½ inches × ⅛ inches × ⅛ inches. The plaque was secured in a stainless steel jig so that 3400 pounds per square inch of bending stress could be applied on the plaque. The sample under stress was then processed according to the steps disclosed in Table 1. Upon completion of the step of electroless metallization, the stressed surface of the plaque was viewed at a magnification of 45 times the normal size using a light microscope. No cracks, crevices or other adverse effects resulting from an application of bending stress were observed on the stressed metallized areas of the plaque. The plaque was removed from the jig and mounted in a clear epoxy solution so that a cross-section of the metallized area could be made, once the epoxy solution hardened. The cross-section was then viewed at a magnification of 1000 times the normal size using a light microscope. No cracks, crevices or other adverse effects were observed in either the metallized layer or on the surface of the substrate.

EXAMPLE 18

A plaque molded from Lexan® polycarbonate ML6000 was treated using the various chemical solutions described below. The substrate was immersed, without cleaning, into the nitrating solution of Table 1 for 6 minutes at 25° C.; water rinsed for 1 minute; immersed in the aqueous ammonia solution of Table 1 for 6 minutes at 25° C.; water rinsed for 5 minute; catalyzed for 6 minutes at 25° C.; water rinsed for 1 minute; immersed in the accelerator for 5 minutes, and finally water rinsed for 5 minutes. The plaque was then electrolessly plated with copper using a Shipley Cuposit® 251 electroless copper bath, formulated as per the recommendations by the manufacturer. The plaque was immersed in the electroless copper bath for 7 minutes while the bath was stirred and maintained at 40° C.±1° C. The plaque was then water rinsed and air dried. The thickness of copper layer deposited on the substrate was measured by x-ray fluorescence and was determined to be 1.5 micrometers in thickness. The copper layer on the substrate was then metallized with a layer of nickel, using an electroless nickel bath as described in example 1. The substrate was immersed in the electroless nickel bath for 5 minutes while the bath was maintained at 50° C.±1° C. The substrate was water rinsed and air dried. The thickness of nickel layer deposited on top of the copper layer was measured by x-ray fluorescence and was determined to be about 0.7 micrometers in thickness. The ASTM tape test was performed in a manner described in example 1, and an adhesion classification 5 resulted. The EMI shielding effectiveness was measured by The Dual Chamber Method (ASTM ES-7-83) developed by The American Society of Testing and Materials. Attenuation values were measured at 30 MegaHertz, 100 MegaHertz, 300 MegaHertz, and 1000 MegaHertz, producing values each in excess of 60 decibels, 70 decibels, 79 decibels, and 73 decibels respectively. It should be stated that the aforementioned attenuation values are well within the present FCC requirements regarding the EMI shielding.

It will be understood that the foregoing description is only illustrative of the present invention and it is not intended that the invention be limited thereto. Numerous variations, changes, substitutions, and modifications will now occur to those skilled in the art which come within the scope of the present invention without departing from the spirit and scope thereof. Accordingly, it is intended that the invention be limited only by the scope of the appended claims.

What is claimed is:

1. An article comprising:
    an aromatic polymer substrate wherein a smooth surface of said substrate has ammonolytically cleaved aromatic polymer molecules containing nitro groups wherein the polymer surface is terminated with nitrophenol and phenol moieties; and
    a metal layer disposed on said surface.

2. The article of claim 1 wherein said metal layer comprises:
    an electrolessly applied primary metal layer disposed on said surfaces; and
    an electrolytically applied or an electrolessly applied secondary metal layer disposed on top of said first layer.

3. The article of claim 1 wherein said first metal layer is copper.

4. The article of claim 1 wherein said first metal layer is nickel.

5. The article of claim 1 wherein said aromatic polymer substrate is a polycarbonate substrate.

6. An article comprising:
    an aromatic polymer substrate wherein a smooth surface of said substrate has ammonolytically cleaved aromatic polymer molecules containing nitro groups; wherein the polymer surface is terminated with nitrophenol and phenol moieties and
    an electrolessly applied metal layer disposed on said surface.

7. An article of claim 6 wherein said metal layer is copper or nickel.

8. An article comprising:
    a polycarbonate substrate wherein a smooth surface of said substrate has ammonolytically cleaved polycarbonate polymer molecules containing nitro groups; and
    a metal layer disposed on said surface.

9. The article of claim 8 wherein said metal layer comprises:
    an electrolessly applied first nickel layer disposed on said surface;
    an electrolessly applied or electrolytically applied copper layer disposed on top of said first nickel layer; and an electrolessly applied or an electrolytically applied second nickel layer disposed on top of said copper layer.

10. An article comprising:
an aromatic polymer substrate having a surface, which has been modified to improve adhesion of metal on said surface by nitrating polymer molecules disposed on said surface and ammonolytically cleaving said nitrated polymer molecules wherein the polymer surface is terminated with nitrophenol and phenol moieties and
a metal layer disposed on said surface.

11. The article of claim 10 wherein said metal layer comprises:
an electrolessly applied primary metal layer disposed on said surface; and
an electrolytically applied or an electrolessly applied secondary metal layer disposed on top of said primary layer.

12. The article of claim 10 wherein said aromatic polymer is polycarbonate.

13. The article of claim 10 wherein said primary layer is nickel and said secondary layer is copper.

14. An article comprising:
a polycarbonate substrate having a surface, which has been modified to improve adhesion of metal on said surface by nitrating polymer molecules disposed on said surface and ammonolytically cleaving said nitrated polymer molecules wherein the polymer surface is terminated with nitrophenol and phenol moieties;
an electrolessly deposited nickel layer disposed on said surface having said ammonolytically cleaved polymer molecules having nitro groups therein; and
an electrolessly or electrolytically deposited copper layer disposed on top of said electrolessly deposited nickel layer.

* * * * *